(12) United States Patent
Kao et al.

(10) Patent No.: US 11,374,317 B2
(45) Date of Patent: Jun. 28, 2022

(54) ANTENNA ARRAY AND LIQUID CRYSTAL DISPLAY USING THE SAME

(71) Applicant: HON HAI PRECISION INDUSTRY CO., LTD., New Taipei (TW)

(72) Inventors: Yi-Tao Kao, New Taipei (TW); Fu-Yen Hsieh, New Taipei (TW); Yu-Hung Tsao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 616 days.

(21) Appl. No.: 16/454,167

(22) Filed: Jun. 27, 2019

(65) Prior Publication Data

US 2020/0381824 A1 Dec. 3, 2020

(30) Foreign Application Priority Data

May 29, 2019 (CN) .......................... 201910458882.9

(51) Int. Cl.
| | | |
|---|---|---|
| H04Q 1/22 | (2006.01) | |
| G02F 1/33 | (2006.01) | |
| H01Q 13/08 | (2006.01) | |
| H01Q 21/00 | (2006.01) | |
| H01Q 3/36 | (2006.01) | |
| H01Q 21/06 | (2006.01) | |
| H01Q 1/48 | (2006.01) | |
| H03H 7/38 | (2006.01) | |
| H01Q 1/22 | (2006.01) | |

(52) U.S. Cl.
CPC ................. *H01Q 3/36* (2013.01); *H01Q 1/22* (2013.01); *H01Q 1/48* (2013.01); *H01Q 21/0006* (2013.01); *H01Q 21/065* (2013.01); *H03H 7/38* (2013.01)

(58) Field of Classification Search
None
See application file for complete search history.

(56) References Cited

U.S. PATENT DOCUMENTS

| | | | | |
|---|---|---|---|---|
| 8,416,361 | B2 * | 4/2013 | Kim | .................... G09F 13/0413 |
| | | | | 362/633 |
| 10,564,487 | B2 * | 2/2020 | Suzuki | ................ H01L 27/1255 |
| 10,700,426 | B2 * | 6/2020 | Haziza | ..................... H01Q 3/38 |

(Continued)

FOREIGN PATENT DOCUMENTS

| | | | | | |
|---|---|---|---|---|---|
| CN | 111149256 | A | * | 5/2020 | ............. C09K 19/02 |
| CN | 113227841 | A | * | 8/2021 | .............. H01P 1/181 |

(Continued)

*Primary Examiner* — Pablo N Tran
(74) *Attorney, Agent, or Firm* — ScienBiziP, P.C.

(57) ABSTRACT

An antenna array for a liquid crystal display able to function without a phase shifter includes at least two antenna units, each with an antenna module and a controlling circuit. The antenna module is at the side of a first substrate, a grounding layer, a feeding portion, a second substrate, and a liquid crystal layer also being included as a stack. The grounding layer and the feeding portion are on sides of the second substrate. The controlling circuit controls rotation of liquid crystal molecules of the liquid crystal layer therein to change a dielectric constant between the grounding layer and the antenna. The operating frequency of each antenna unit is thereby changed and radiation beam or pattern of the antenna array is thereby adjusted.

18 Claims, 4 Drawing Sheets

(56) References Cited

U.S. PATENT DOCUMENTS

| | | | |
|---|---|---|---|
| 10,756,430 B2* | 8/2020 | Asagi | H01Q 3/44 |
| 11,018,420 B2* | 5/2021 | Maruyama | G06F 3/0446 |
| 2020/0251812 A1* | 8/2020 | Tseng | H01L 21/045 |
| 2021/0067937 A1* | 3/2021 | Kim | G02F 1/13454 |
| 2021/0091460 A1* | 3/2021 | Liang | H01Q 1/364 |

FOREIGN PATENT DOCUMENTS

| | | | | |
|---|---|---|---|---|
| JP | 6980861 B2 * | 12/2021 | | H01Q 1/38 |
| WO | WO-2020189451 A * | 9/2020 | | |

* cited by examiner

ANTENNA ARRAY AND LIQUID CRYSTAL DISPLAY USING THE SAME

FIELD

The subject matter herein generally relates to antennas.

BACKGROUND

A liquid crystal display (LCD) can include a patch antenna unit for transmitting and receiving signals. A phase shifter can shift the operating frequency of the patch antenna unit. However, the addition of the phase shifter may take up a large volume and add a complex circuit to the patch antenna unit.

Therefore, there is room for improvement within the art.

BRIEF DESCRIPTION OF THE DRAWINGS

Implementations of the present disclosure will now be described, by way of embodiment, with reference to the attached figures.

DETAILED DESCRIPTION

Figure 1:
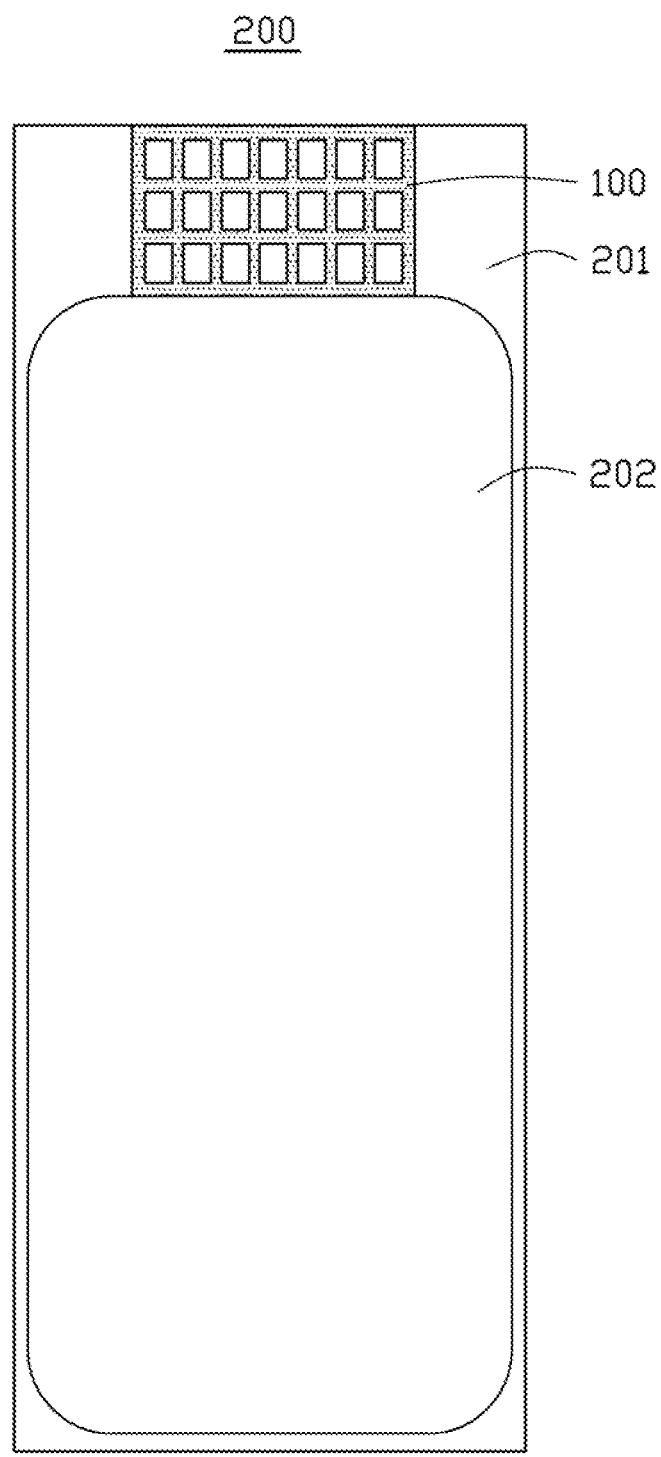
FIG. 1 is an isometric view of an embodiment of an LCD according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

The present disclosure is described in relation to an antenna array and a liquid crystal display (LCD) using the same.

FIG. 1 illustrates an antenna array 100 in an LCD 200 according to an embodiment. The antenna array 100 can receive and transmit wireless signals.

The LCD 200 includes a base 201 and a display region 202 positioned on the base 201. The antenna array 100 is positioned on the base 201. In this embodiment, the antenna array 100 is positioned at a non-display region of the LCD 200, for example, at an end of the display region 202. In other embodiment, the antenna array 100 may be positioned at the other end or sides of the display region 202.

Figure 2:
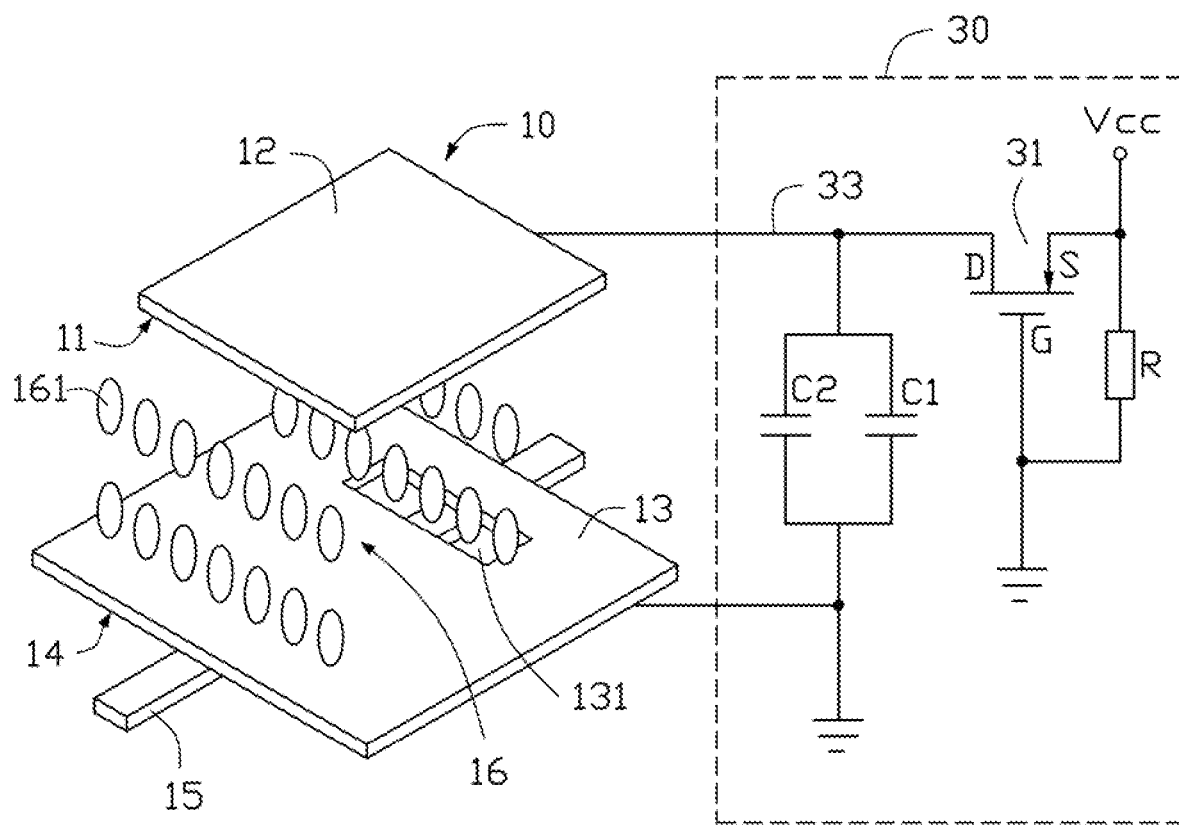
FIG. 2 is an isometric view of an embodiment of an antenna array.
Figure 3:
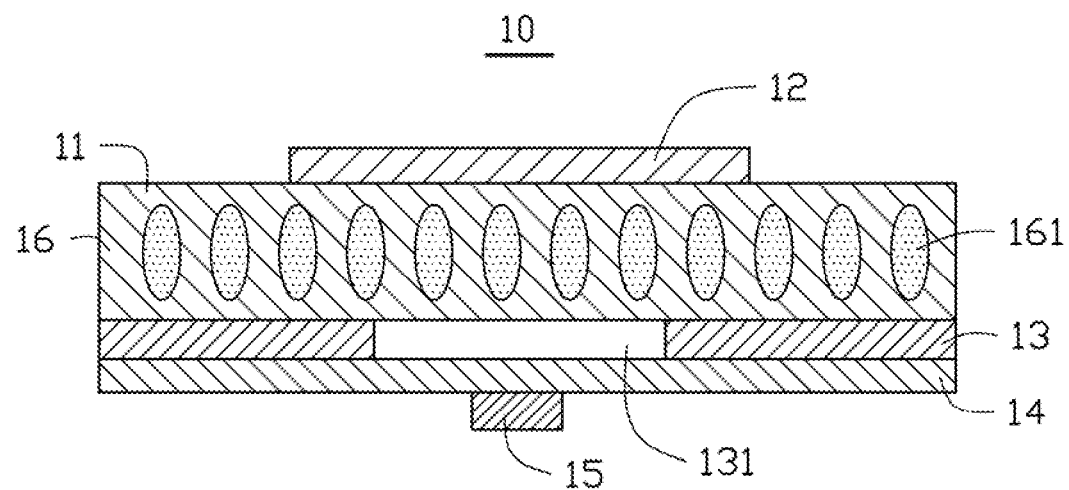
FIG. 3 is an assembled view of an embodiment of an antenna unit.

Referring to FIG. 2 and FIG. 3, the antenna array 100 includes at least two antenna units 10a. Each antenna unit 10a includes an antenna module 10 and a controlling circuit 30 electrically connected to the antenna module 10.

The antenna module 10 includes a first substrate 11, an antenna 12, a grounding layer 13, a second substrate 14, a feeding portion 15, and a liquid crystal layer 16.

The antenna 12, the first substrate 11, the liquid crystal layer 16, the grounding layer 13, and the second substrate 14 are stacked together in that order. The controlling circuit 30 controls rotation of liquid crystal molecules 161 of the liquid crystal layer 16 in the liquid crystal layer 16, changing a dielectric constant between the grounding layer 13 and the antenna 12 and thereby changing an operating frequency of the antenna unit 10a and further adjusting a radiation pattern of the antenna array 100.

In this embodiment, the first substrate 11 is substantially rectangular and supports the antenna 12. In this embodiment, the first substrate 11 can be made of one of polymer, glass, and ceramic.

The antenna 12 is a patch antenna and is substantially rectangular. In other embodiment, the antenna 12 can be other shape. The antenna 12 is positioned at one side of the first substrate 11.

The grounding layer 13 provides ground connection for the antenna 12. The grounding layer 13 also defines a coupling slot 131. In this embodiment, the coupling slot 131 is substantially rectangular. In other embodiment, the coupling slot 131 can also be other shape.

In this embodiment, the second substrate 14 is substantially rectangular and supports the grounding layer 13. The grounding layer 13 is positioned on one side of the second substrate 14 facing the antenna 12. In this embodiment, the second substrate 14 can be made of one of polymer, glass, and ceramic.

The feeding portion 15 feeds the antenna unit 10a. The feeding portion 15 can be made of one of a microstrip line, a coplanar microstrip line, a slotted transmission line, and a slot coupled microstrip line. In this embodiment, the feeding portion 15 is substantially strip-shaped. The feeding portion 15 is positioned at the other side of the second substrate 14 opposite to the grounding layer 13. The feeding portion 15 is substantially at a central axis of the second substrate 14 corresponding to the coupling slot 131.

The liquid crystal layer 16 can be positioned in the base 201 of the LCD 200, which can be an existing liquid crystal substrate in the LCD 200. The antenna array 100 is embedded in the LCD 200. The rotation of the liquid crystal molecules 161 in the liquid crystal layer 16 can change a dielectric constant between the antenna 12 and the grounding layer 13, thereby the operating frequency of the antenna unit 10a is shifted.

In this embodiment, the controlling circuit 30 includes a first capacitor C1 and a switch 31 electrically connected to the first capacitor C1. A first end of the first capacitor C1 is electrically connected to the antenna 12. A second end of the first capacitor C1 is electrically connected to the grounding layer 13 and grounded. The switch 31 controls a voltage between the first end and the second end of the first capacitor C1. The first capacitor C1 is configured for driving the liquid crystal molecules 161 to rotate. When the switch 31 is turned on, the liquid crystal molecules 161 rotate. When the switch 31 is turned off, the liquid crystal molecules 161 return to their resting state.

In this embodiment, the switch 31 is a field effect transistor. A drain D of the switch 31 is connected to the first end of the capacitor C1. A gate G of the switch 31 is grounded. A source S of the switch 31 is connected to a driving voltage Vcc and also connected to the gate G by a resistor R.

In this embodiment, the controlling circuit 30 further includes a microstrip line 33 and a second capacitor C2. The microstrip line 33 is positioned between the antenna 12 and the first end of first capacitor C1. The second capacitor C2 and the first capacitor C1 are connected in parallel. Impedance of the antenna 12 is adjusted for matching by the second capacitor C2 and the microstrip line 33 acting cooperatively. In this embodiment, the microstrip line 33 is a quarter-wavelength microstrip line.

Figure 4:
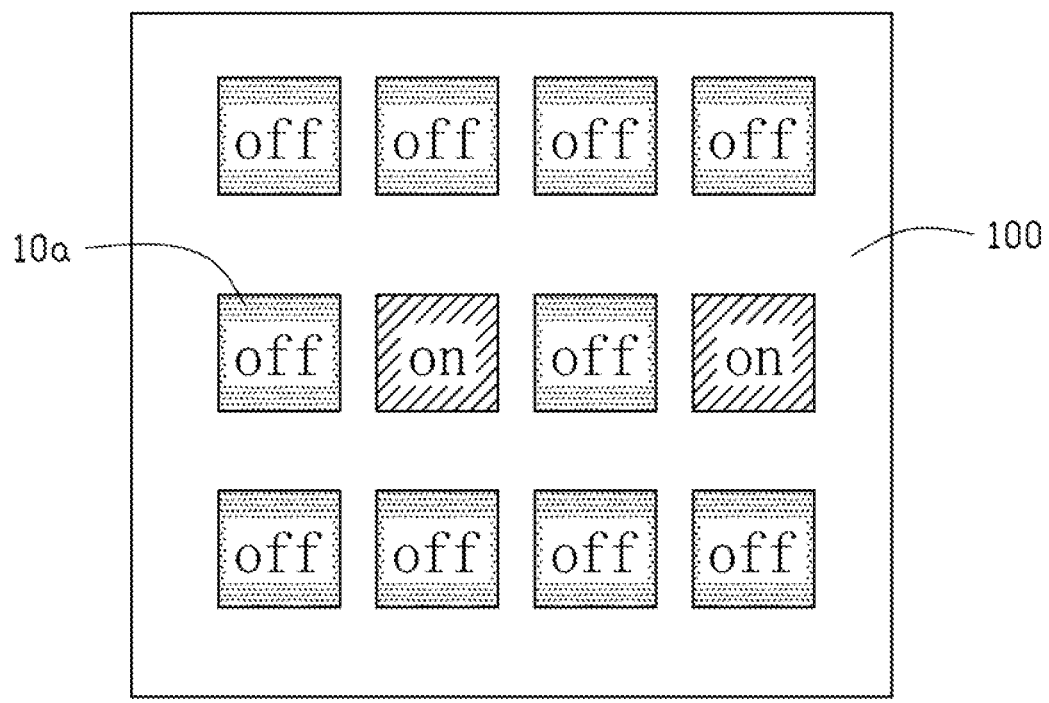
FIG. 4 is a cross-section view of the antenna unit of FIG. 3.

Referring to FIG. 4, in this embodiment, the antenna array 100 includes a plurality of antenna units 10a. The antenna array 100 is an N×M antenna array, wherein, N and M are natural numbers. In this embodiment, N is 3 and M is 4. An arrangement of the antenna array 100 can be adjusted according to available free space in the liquid crystal display 200, it can be circular or other arrangement. In this embodiment, the arrangement of the antenna array 100 being arrayed as the N×M array facilitates control of the antenna unit 10a, the antenna unit 10a also occupies less space and the regular shape being easy to assemble.

When the antenna array 100 is to transmit and receive wireless signals, the radiation pattern of the antenna array 100 can be adjusted by controlling the operating frequency of each antenna unit 10a. The radiation pattern of the antenna array 100 is determined by a sum of the operating frequencies of each antenna unit 10a. Specifically, the switch 31 can be controlled by the driving voltage Vcc. When the switch 31 is turned on, the liquid crystal molecules 161 rotate. When the switch 31 is turned off, the liquid crystal molecules 161 return to their resting state and the rotated state of the liquid crystal molecules 161 changes the dielectric constant between the antenna 12 and the grounding layer 13, thereby the operating frequency of the antenna unit 10a is shifted. By switching off the switches 31 of the antenna unit 10a or some of them (for example, the switches labeled off in FIG. 4), the radiation efficiency of the antenna array 100 is reduced, effectively adjusting a beam direction of the antenna array 100. Specifically, the more switches 31 there are in the off state, the lower is the radiation efficiency of the antenna array 100 which can be obtained.

The antenna array 100 can shift the operating frequency of the antenna unit 10a without adding a phase shifter, a simpler circuitry and a smaller volume being obtained.

The embodiments shown and described above are only examples. Many details are often found in the art such as the other features of the antenna structure and the wireless communication device. Therefore, many such details are neither shown nor described. Even though numerous characteristics and advantages of the present disclosure have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims.

It will therefore be appreciated that the embodiments described above may be modified within the scope of the claims.

What is claimed is:

1. An antenna array comprising:
   at least two antenna units, each of the antenna units comprising:
     an antenna module, the antenna module comprising:
       a first substrate;
       an antenna positioned at a side of the first substrate;
       a grounding layer;
       a feeding portion;
       a second substrate, wherein the grounding layer and the feeding portion are positioned at two sides of the second substrate;
       a liquid crystal layer, wherein the antenna, the first substrate, the liquid crystal layer, the grounding layer, and the second substrate are stacked together in that order; and
     a controlling circuit configured for controlling rotation of liquid crystal molecules of the liquid crystal layer to change a dielectric constant between the grounding layer and the antenna, thereby changing an operating frequency of each of the antenna units and adjusting a radiation pattern of the antenna array.

2. The antenna array of claim 1, wherein the controlling circuit comprises a first capacitor and a switch electrically connected to the first capacitor, a first end of the first capacitor is electrically connected to the antenna, a second end of the second capacitor is electrically connected to the grounding layer and grounded, the switch controls a voltage between the first end and the second end, the first capacitor is configured for driving the liquid crystal molecules to rotate.

3. The antenna array of claim 2, wherein the switch is a field effect transistor, a drain of the switch is electrically connected to the first end, a gate of the switch is grounded, a source of the switch is electrically connected to a driving voltage and also electrically connected to the gate by a resistor.

4. The antenna array of claim 2, wherein the controlling circuit further comprises a microstrip line and a second capacitor, the microstrip line is positioned between the antenna and the first end, the second capacitor and the first capacitor are electrically connected in parallel, the second capacitor and the microstrip line are configured for cooperatively adjusting a matching impedance of the antenna.

5. The antenna array of claim 4, wherein the microstrip line is a quarter-wavelength microstrip line.

6. The antenna array of claim 1, wherein the antenna array comprises a plurality of antenna units, and the antenna array is an N×M antenna array, wherein, N and M are natural numbers.

7. The antenna array of claim 1, wherein the antenna is a patch antenna and is substantially rectangular.

8. The antenna array of claim 1, wherein the first substrate and the second substrate are made of one of polymer, glass, and ceramic.

9. The antenna array of claim 1, wherein the feeding portion is made of one of a microstrip line, a coplanar microstrip line, a slotted transmission line, and a slot coupled microstrip line.

10. A liquid crystal display comprising:
    a base;
    an antenna array positioned on the base, the antenna array comprising:

at least two antenna units, each of the antenna units comprising:
an antenna module, the antenna module comprising:
a first substrate;
an antenna positioned at a side of the first substrate;
a grounding layer;
a feeding portion;
a second substrate, wherein the grounding layer and the feeding portion are positioned at two sides of the second substrate,
a liquid crystal layer, wherein the antenna, the first substrate, the liquid crystal layer, the grounding layer, and the second substrate are stacked together in that order; and
a controlling circuit, configured for controlling rotation of liquid crystal molecules of the liquid crystal layer to change a dielectric constant between the grounding layer and the antenna, thereby changing an operating frequency of each of the antenna units and adjusting a radiation pattern of the antenna array.

11. The liquid crystal display of claim 10, wherein the controlling circuit comprises a first capacitor and a switch electrically connected to the first capacitor, a first end of the first capacitor is electrically connected to the antenna, a second end of the second capacitor is electrically connected to the grounding layer and grounded, the switch controls a voltage between the first end and the second end, the first capacitor is configured for driving the liquid crystal molecules to rotate.

12. The liquid crystal display of claim 11, wherein the switch is a field effect transistor, a drain of the switch is connected to the first end, a gate of the switch is grounded, a source of the switch is connected to a driving voltage and also connected to the gate by a resistor.

13. The liquid crystal display of claim 11, wherein the controlling circuit further comprises a microstrip line and a second capacitor, the microstrip line is positioned between the antenna and the first end, the second capacitor and the first capacitor are connected in parallel, the second capacitor and the microstrip line are configured for cooperatively adjusting a matching impedance of the antenna.

14. The liquid crystal display of claim 13, wherein the microstrip line is a quarter-wavelength microstrip line.

15. The liquid crystal display of claim 10, wherein the antenna array includes a plurality of antenna units, and the antenna array is an N×M antenna array, wherein, N and M are natural numbers.

16. The liquid crystal display of claim 10, wherein the antenna is a patch antenna and is substantially rectangular.

17. The liquid crystal display of claim 10, wherein the first substrate and the second substrate are made of one of polymer, glass, and ceramic.

18. The liquid crystal display of claim 10, wherein the feeding portion is made of one of a microstrip line, a coplanar microstrip line, a slotted transmission line, and a slot coupled microstrip line.

* * * * *